United States Patent
Marutani et al.

(10) Patent No.: US 9,130,138 B2
(45) Date of Patent: Sep. 8, 2015

(54) LIGHT-EMITTING DEVICE MANUFACTURING METHOD

(71) Applicant: NICHIA CORPORATION, Anan-shi (JP)

(72) Inventors: Yukitoshi Marutani, Anan (JP); Tadaaki Miyata, Yokohama (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 13/954,878

(22) Filed: Jul. 30, 2013

(65) Prior Publication Data

US 2014/0038325 A1   Feb. 6, 2014

(30) Foreign Application Priority Data

Jul. 31, 2012  (JP) ................................. 2012-170654

(51) Int. Cl.
| | | |
|---|---|---|
| *H01L 25/075* | (2006.01) | |
| *H01L 33/62* | (2010.01) | |
| *H01L 27/15* | (2006.01) | |
| *F21K 99/00* | (2010.01) | |
| *H01L 33/52* | (2010.01) | |

(52) U.S. Cl.
CPC . *H01L 33/62* (2013.01); *F21K 9/90* (2013.01); *H01L 25/0753* (2013.01); *H01L 27/153* (2013.01); *H01L 33/52* (2013.01); *H01L 2924/0002* (2013.01)

(58) Field of Classification Search
CPC .......................... H01L 27/153; H01L 25/0753
USPC .................................... 438/28; 257/E27.121
See application file for complete search history.

(56) References Cited

U.S. PATENT DOCUMENTS

| | | | |
|---|---|---|---|
| 2010/0117537 A1 | 5/2010 | Horppu et al. | |
| 2011/0058372 A1 | 3/2011 | Lerman et al. | |
| 2011/0204392 A1 | 8/2011 | Weekamp et al. | |
| 2011/0305011 A1* | 12/2011 | Lo et al. ................... | 362/217.02 |
| 2013/0056788 A1* | 3/2013 | Haraguchi et al. .............. | 257/99 |

FOREIGN PATENT DOCUMENTS

| | | |
|---|---|---|
| JP | A-1993072978 | 3/1993 |
| JP | U-1993016400 | 3/1993 |
| JP | A-1994302864 | 10/1994 |
| JP | A-1998208514 | 8/1998 |
| JP | A-2005026303 | 1/2005 |
| JP | 2005-63995 A | 3/2005 |
| JP | 2009-528685 A | 8/2009 |
| JP | 2009-535799 A | 10/2009 |
| JP | A-2010526400 | 7/2010 |
| JP | 0003167296 | 3/2011 |

* cited by examiner

*Primary Examiner* — Amar Movva
(74) *Attorney, Agent, or Firm* — Foley & Lardner LLP

(57) ABSTRACT

A method for manufacturing a light-emitting device comprises retaining a conductor wire so that a straight-line distance between adjacent mounting portions while the conductor is retained is less than a distance along the conductor wire between the adjacent mounting portions; mounting a plurality of light emitting diodes to respective ones of the mounting portions on the retained conductor wire; and after the mounting step, sealing the plurality of light-emitting diodes mounted on the conductor wire.

16 Claims, 15 Drawing Sheets

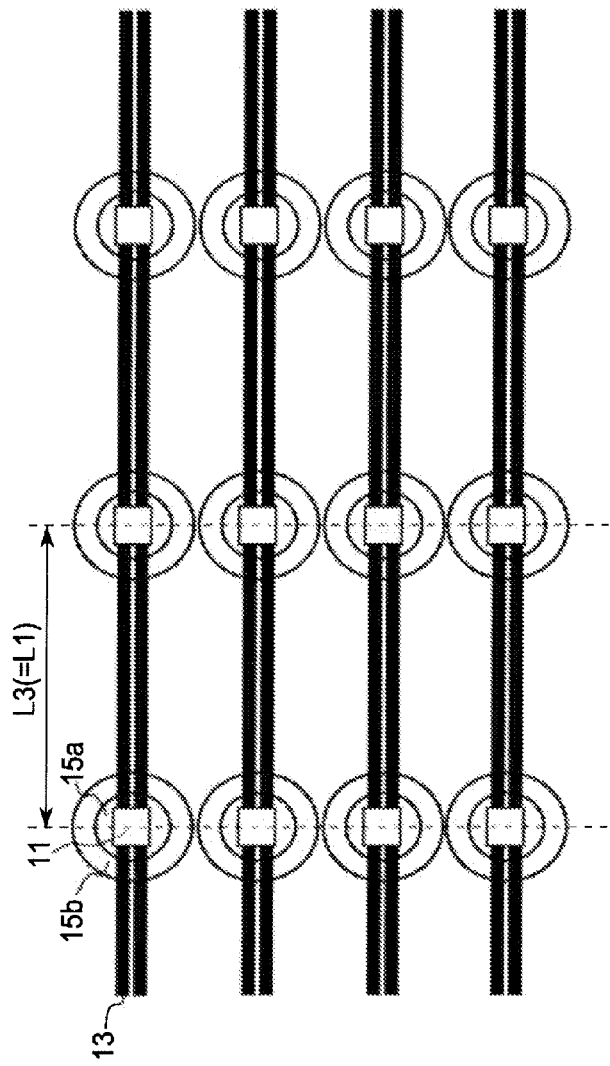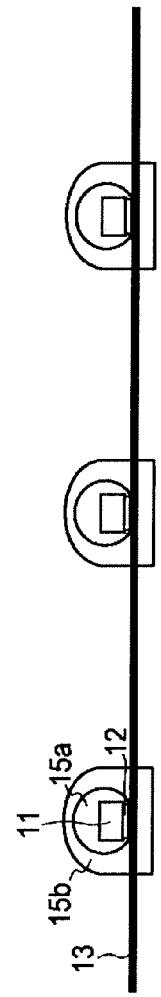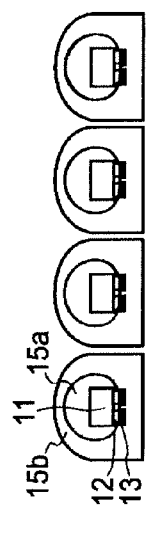
FIG. 3A
FIG. 3B
FIG. 3C

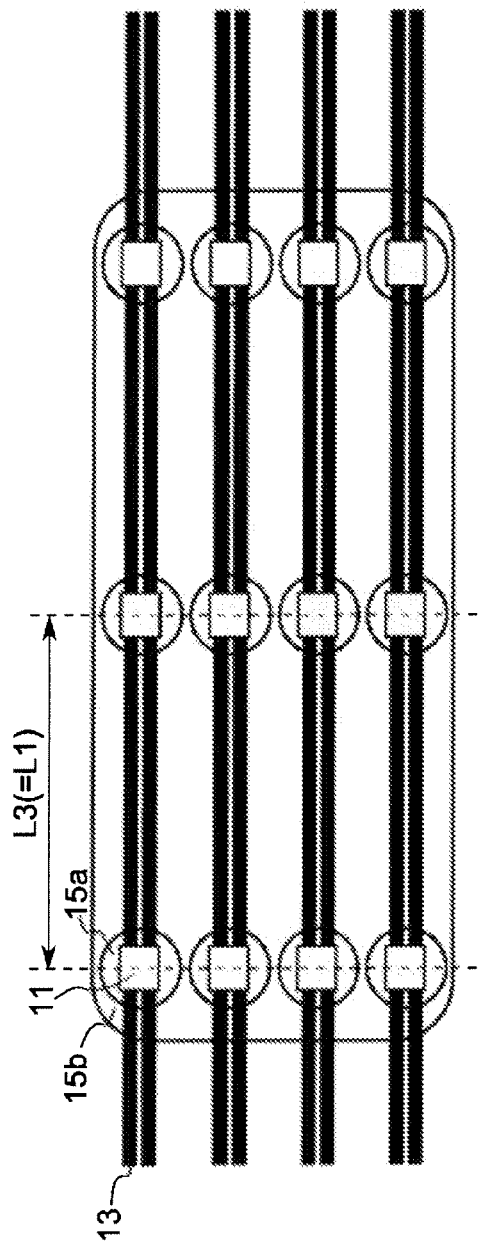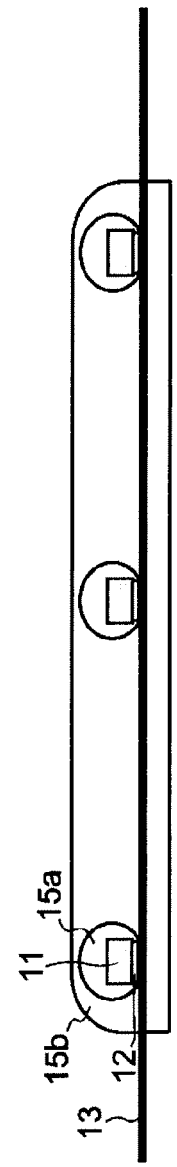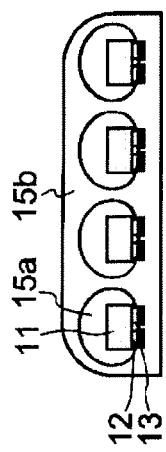
FIG. 4A
FIG. 4B
FIG. 4C

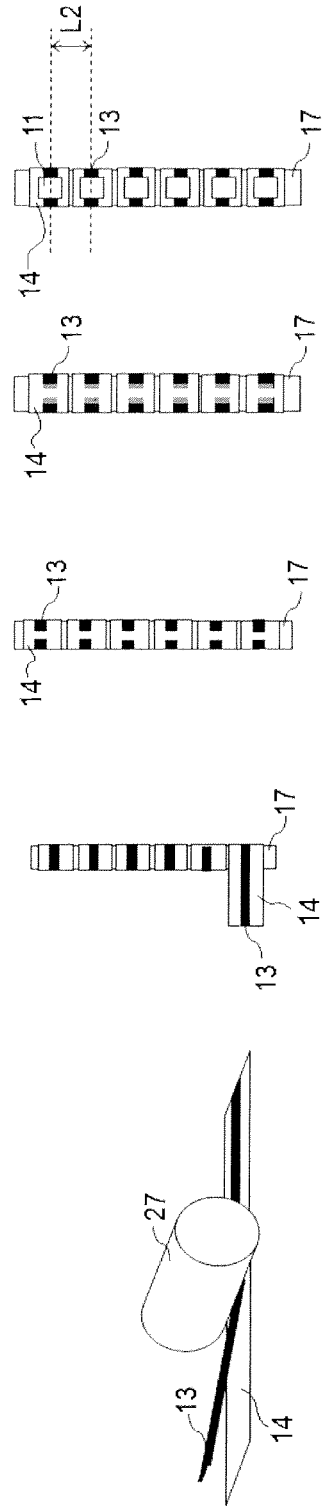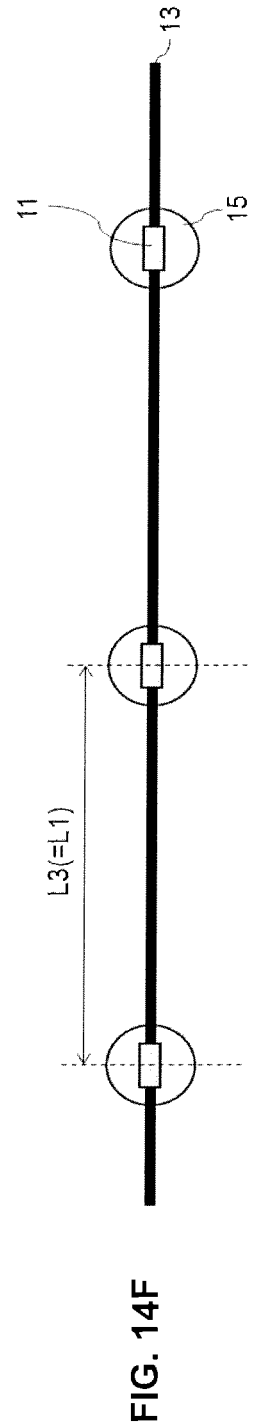

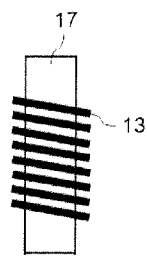
FIG. 15A
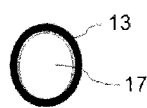
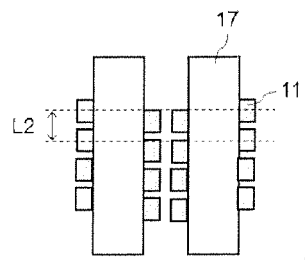
FIG. 15C
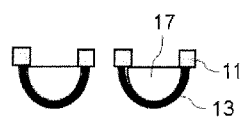
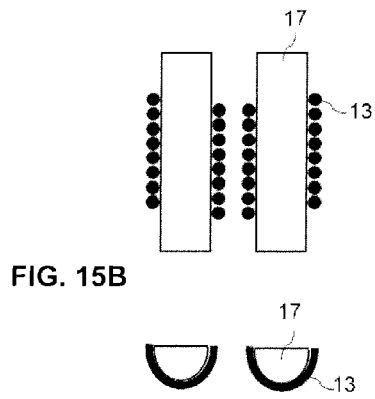
FIG. 15B
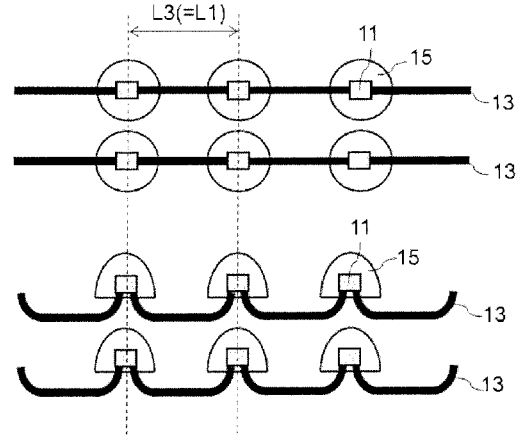
FIG. 15D

LIGHT-EMITTING DEVICE MANUFACTURING METHOD

BACKGROUND

1. Field

The present disclosure relates to a method of manufacturing a light-emitting device using a light-emitting diode.

2. Description of the Related Art

Recently, light-emitting devices using a light-emitting diode such as LED lighting or television backlights using an LED are becoming widely popular.

However, since light-emitting devices using a light-emitting diode are still very expensive compared to conventional light-emitting devices such as an incandescent bulb or a fluorescent lamp, a further reduction in prices must be achieved in order to promote popularization of such light-emitting devices.

SUMMARY

In one embodiment, a method for manufacturing a light-emitting device comprises retaining a conductor wire so that a straight-line distance between adjacent mounting portions while the conductor is retained is less than a distance along the conductor wire between the adjacent mounting portions; mounting a plurality of light emitting diodes to respective ones of the mounting portions on the retained conductor wire; and after the mounting step, sealing the plurality of light-emitting diodes mounted on the conductor wire.

In one aspect, the conductor wire is intersected with a plurality of rod members to set the straight-line distance between the adjacent mounting portions.

In one aspect, the conductor wire is intersected with a plurality of rod members and a plurality of protrusions which are alternately arranged to set the straight-line distance between the adjacent mounting portions.

In one aspect, the conductor wire is wound around a rod member to set the straight-line distance between the adjacent mounting portions.

In one aspect, the conductor wire is wound around a rod member and the rod member is subsequently cut along a longitudinal direction to set the straight-line distance between the adjacent mounting portions.

In one aspect, the method further comprises releasing the retention of the conductor wire on which the plurality of light-emitting diodes are mounted, wherein a straight-line distance between the adjacent mounting portions after the retention is released is less than or equal to the distance along the conductor wire between the adjacent mounting portions and greater than the straight-line distance between adjacent mounting portions while the conductor is retained.

In one aspect, the plurality of light-emitting diodes mounted on the conductor wire are sealed by a translucent sealing member.

In one aspect, the plurality of light-emitting diodes are individually sealed by a phosphor-containing first sealing member, and the first sealing member is subsequently sealed by a second sealing member.

In one aspect, the plurality of light-emitting diodes are individually sealed by a phosphor-containing first sealing member, and a plurality of first sealing members are subsequently collectively sealed by a second sealing member.

In one aspect, the conductor wire is attached to a substrate, and the retention is performed while the conductor wire is attached to the substrate.

In one aspect, the scaling step is performed before the releasing step.

In one aspect, the sealing step is performed after the releasing step.

In one aspect, the light emitting diodes are LED chips.

According to embodiments of the present invention, a light-emitting device using a light-emitting diode can be manufactured more inexpensively than in the past.

BRIEF DESCRIPTION OF THE DRAWINGS

FIG. 2 is a diagram showing an example of an LED chip, in which

FIG. 3 is a diagram illustrating a first example of a sealing method, in which FIG. 3A is a top view. FIG. 3B is a side view, and FIG. 3C is a front view;

FIG. 4 is a diagram illustrating a second example of a sealing method, in which FIG. 4A is a top view, FIG. 4B is a side view, and FIG. 4C is a front view;

FIG. 5 is a diagram illustrating an example (Example 1) of a light-emitting device manufacturing method using a fabric-style bending method, in which

FIG. 6 is a diagram illustrating an example (Example 2) of a light-emitting device manufacturing method using a fabric-style bending method, in which

FIG. 7 is a diagram illustrating an example (Example 3) of a light-emitting device manufacturing method using a fabric-style bending method, in which

FIG. 8 is a diagram illustrating an example (Example 1) of a light-emitting device manufacturing method using a rod-and-protrusion bending method, in which

FIG. 9 is a diagram illustrating an example (Example 2) of a light-emitting device manufacturing method using a rod-and-protrusion bending method, in which

FIG. 10 is a diagram illustrating an example (Example 3) of a light-emitting device manufacturing method using a rod-and-protrusion bending method, in which

FIG. 11 is a diagram illustrating an example (Example 4) of a light-emitting device manufacturing method using a rod-and-protrusion bending method, in which

FIG. 12 is a diagram illustrating an example (Example 1) of a light-emitting device manufacturing method using a rod-winding bending method, in which

FIG. 13 is a diagram illustrating an example (Example 2) of a light-emitting device manufacturing method using a rod-winding bending method, in which

FIG. 14 is a diagram illustrating an example (Example 3) of a light-emitting device manufacturing method using a rod-winding bending method, in which FIG. 14A is a diagram showing how a conductor wire is attached to a substrate using a roller, FIG. 14B is an upper view of a rod member and the conductor wire and the substrate wound around the rod member (prior to cutting), FIG. 14C is an upper view of the rod member and the conductor wire and the substrate wound around the rod member (after cutting), FIG. 14I) is an upper view and a front view of the rod member and the conductor wire and the substrate wound around the rod member (after removal of coating), FIG. 14E is an upper view and a front view of the rod member and the conductor wire and the substrate wound around the rod member (after mounting), and FIG. 14F is a diagram showing an example of the extended conductor wire; and FIG. 15 is a diagram illustrating an example of a light-emitting device manufacturing method using a rod-cutting bending method, in which FIG. 15A is an upper view and a front view of a rod member and a conductor wire wound around the rod member (prior to cutting), FIG. 15B is an upper view and a front view of the rod member and the conductor wire wound around the rod member (after cutting), FIG. 15C is an upper view and a front view of the conductor wire to which the plurality of light-emitting diodes are mounted, and FIG. 15D is an upper view and a side view of the conductor wire that has been extended.

DETAILED DESCRIPTION

Hereinafter, embodiments of the present invention will be described with reference to the accompanying drawings.

Figure 1:
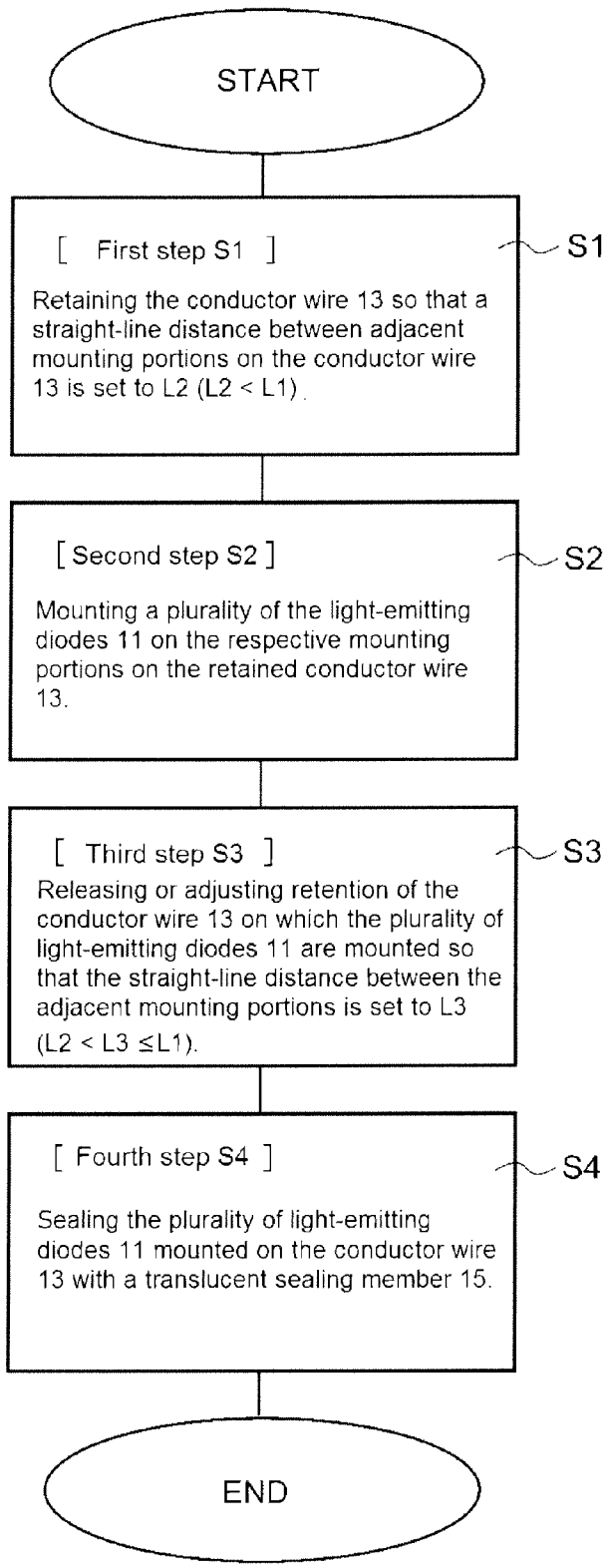
FIG. 1 is a flow chart for describing a light-emitting device manufacturing method according to one embodiment.

FIG. 1 is a flow chart for describing a light-emitting device manufacturing method according to one embodiment of the present invention.

As shown in FIG. 1, the light-emitting device manufacturing method according to one embodiment is a method of manufacturing a light-emitting device in which a plurality of light-emitting diodes 11 are mounted to mounting portions on a conductor wire 13, and comprises a first step S1, a second step S2, a third step S3, and a fourth step S4.

[First Step S1]

The first step S1 is a step of retaining the conductor wire 13 so that a straight-line distance between adjacent mounting portions on the conductor wire 13 is set to L2 (L2<L1), where L1 and L2 are real numbers greater than 0 and L1 denotes a distance along the conductor wire 13 between the adjacent mounting portions. Specifically, a distance along the conductor wire 13 is a length of the conductor wire 13.

(Conductor Wire 13)

While various conductive materials can be used as the conductor wire 13, a highly conductive material is favorably used. For example, a metal wire with low electrical resistivity such as copper, gold, aluminum, and silver or a composite material thereof (a copper-clad aluminum wire, an alloy wire, or the like) can be favorably used. In addition, a material that is easily bent is favorable. Furthermore, a material that is less susceptible to damage (less susceptible to fatigue) even when bent is favorable. Moreover, noble metal plating using palladium, Pt, Ag, or the like or tin-based plating may be applied to the conductor wire 13. In particular, since Ag plating produces high optical reflectivity, brightness of the light-emitting device can be improved and is therefore favorable. In addition, a material that is compatible with a member used to mount the light-emitting diodes 11 (to be described later) to the mounting portions is favorable. Specifically, for example, when a solder material is used as the mounting member, a material with noble metal plating or tin-based plating is favorable.

As the conductor wire 13, a coated conductor wire in which a metal wire is coated by an insulating member may be used. By using a coated conductor wire, a plurality of conductor wires can be brought into contact with each other. As a result, various circuits can be assembled. As the coated conductor wire, for example, magnet wires (an enameled wire, a rectangular copper wire, a streamlined wire, parallel wires, a copper-clad aluminum wire, or a fiber or paper covered copper winding wire) or the like can be used.

In addition, as the conductor wire 13, a rectangular wire or a circular wire that is partially flattened using a press or a roller can also be used. Accordingly, a joining area with the light-emitting diodes 11 can be secured and the light-emitting diodes 11 can be readily mounted. Alternatively, the conductor wire 13 may be an aggregate of a plurality of wire rods such as a twisted wire. A thickness or a width of the conductor wire 13 may range between several tenths of mm to several mm depending on properties required for the light-emitting device, a size of the light-emitting diodes 11 to be mounted, and the like.

Furthermore, as the conductor wire 13, a member created by covering a surface of a string that is an insulator with a conductor and further coating the conductor with an insulator can be used. By using such a conductor wire, a plurality of conductor wires can be brought into contact with each other in a similar manner to using a coated conductor wire. Therefore, various circuits can be assembled and, at the same time, a light-weight light-emitting device can be realized.

(Straight-line Distance L2 Between Adjacent Mounting Portions)

Methods of setting a straight-line distance between the adjacent mounting portions to L2 include bending, folding, and twisting the conductor wire 13. In doing so, an auxiliary member such as a rod member can be used. A fabric-style bending method, a rod-and-protrusion bending method, a rod-winding bending method, a rod-cutting bending method, and the like (to be described later) are examples of methods of setting the straight-line distance between the adjacent mounting portions to L2.

(Mounting Portion)

A plurality of mounting portions are provided. Two mounting portions may be provided or three or more mounting portions may be provided.

When a coated conductor wire is used as the conductor wire 13, at a mounting portion on the conductor wire 13, coating is removed by polishing or heat generated by an air heater, solder, or light to expose a core so that the conductor wire 13 can be electrically connected to the light-emitting diodes 11.

The mounting portion on the conductor wire 13 is favorably planarized by a press or the like and subsequently removed of its coating to expose a core thereof. Accordingly, mounting of the light-emitting diodes 11 is stabilized.

[Second Step S2]

The second step S2 is a step of mounting a plurality of the light-emitting diodes 11 on the respective mounting portions on the retained conductor wire 13.

(Mounting of Light-emitting Diodes 11)

When mounting the light-emitting diodes 11 prior to packaging, examples of modes of mounting the light-emitting diodes 11 include a combination of wire bonding and die bonding, and flip-chip mounting. In particular, according to flip-chip mounting, since the placement of the light-emitting diodes 11 on the conductor wire 13 and the electrical connection of the light-emitting diodes 11 and the conductor wire 13 can be performed at the same time, mass productivity can be improved. When performing flip-chip mounting, two or more conductor wire 13 which become positive and negative electrodes are retained in the first step S1.

As a joining material (refer to reference numeral 12 in FIGS. 3 and 4 to be described later) for mounting the light-emitting diodes 11 to the mounting portions, when electrically connecting the light-emitting diodes 11 and the conductor wire 13 (the mounting portions) to one another, conductive joining materials including a solder such as Au—Sn, Sn—Cu—Ag, Sn—Cu, Sn—Bi, and Sn—Zn, an anisotropic conductive paste, a silver paste, a copper paste, a carbon paste, and a bump made of a metallic material such as Au can be used. Meanwhile, when an electric connection is not performed, a thermosetting resin such as an epoxy resin or a silicone resin with an insulating property can be used. In addition, for example, electrodes of the light-emitting diodes 11 and the conductor wire 13 can be directly joined without using a joining material by ultrasonic welding, fusing, or the like.

A fine wire made of a metal such as Au, Ag, Al, and Cu, an alloy thereof, or a plated alloy can be used as wires for wire bonding. Au or an alloy thereof can be preferably used as a bump for flip-chip mounting.

(Light-emitting Diode 11)

As the light-emitting diodes 11, for example, various light-emitting diodes such as a surface mount LED, a lamp LED, an LED chip, and a chip-size packaged LED can be used. In addition, for example, an LED chip in which a blue light-emitting GaN-based semiconductor is laminated on a translucent substrate such as a sapphire substrate can be particularly favorably used as the light-emitting diodes 11 by combining with a wavelength converting member (to be described later) in a light-emitting device to be used as an illuminating device.

When performing flip-chip mounting, LED chips in which positive and negative electrodes are formed in approximately equal sizes are favorably used as the light-emitting diodes 11. In particular, LED chips are favorably used in which an insulating film is provided between a mounting electrode and an electrode that comes into contact with a semiconductor layer and in which the mounting electrode is provided over a larger area than the electrode that comes into contact with a semiconductor layer (an example of such an LED chip is shown in FIG. 2). Accordingly, since mounting on a conductor wire with a limited mounting area can be performed more readily, brightness and mass productivity of a light-emitting device can be achieved.

Figure 2A:
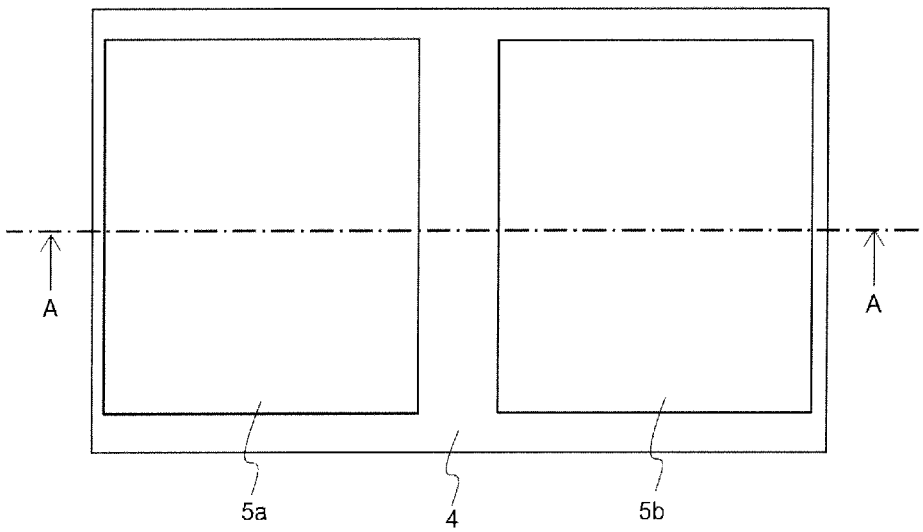
FIG. 2A is a plan view.
Figure 2B:
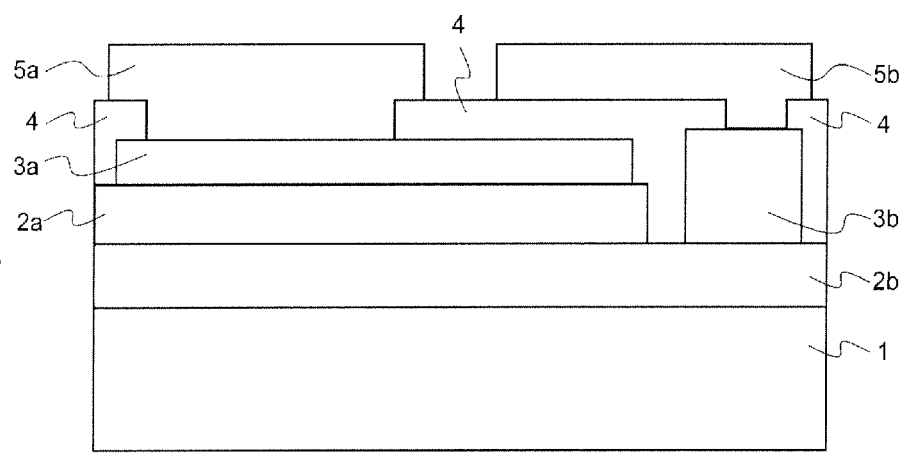
FIG. 2B is a sectional view showing a cross section taken along A-A in FIG. 2A.

FIG. 2 is a diagram showing an example of an LED chip, in which FIG. 2A is a plan view, and FIG. 2B is a sectional view showing a cross section taken along A-A in FIG. 2A. The LED chip according to the example shown in FIG. 2 comprises a sapphire substrate 1, a p-type semiconductor layer 2a and an n-type semiconductor layer 2b, a p-electrode 3a and an n-electrode 3b, an insulating film 4, and a p-side pad electrode 5a and an n-side pad electrode 5b.

The insulating film 4 is provided between the p-side pad electrode 5a and the n-side pad electrode 5b, and the n-side pad electrode 5b is provided on the insulating film 4 over a wider area than an area of contact between the n-type semiconductor layer 2b and the n-electrode 3b. In addition, the p-side pad electrode 5a and the n-side pad electrode 5b are formed in approximately equal sizes. As described above, using such an LED chip as the light-emitting diodes 11 enables mounting on the conductor wire 13 with a limited mounting area to be performed more readily. As a result, brightness and mass productivity of a light-emitting device can be achieved. For example, with the LED chip shown in FIG. 2, two electrodes are provided at both side portions in a longitudinal direction of a rectangular shape of the LED chip at a similar width as a width of the rectangle, an electrode-unformed portion in which an electrode is not formed is provided between the two electrodes in the longitudinal direction, and the electrode-unformed portion is smaller than the two electrodes. By using such an LED chip in the light-emitting device according to this embodiment, a relatively small LED chip can be readily flip-chip mounted at an arbitrary spacing. In addition, a rectangular LED chip in which one side ranges from around 0.1 mm to 0.3 mm can be favorably used.

[Third Step S3]

The third step S3 is a step of releasing or adjusting retention of the conductor wire 13 on which the plurality of light-emitting diodes 11 are mounted so that the straight-line distance between the adjacent mounting portions is set to L3 (L2<L3≤L1), where L3 is a real number greater than 0. A case where L3=L1 will be discussed in an example to be described later. By adopting L3<L1, the distance between light-emitting diodes can be adjusted after mounting.

[Fourth Step S4]

The fourth step S4 is a step of sealing the plurality of light-emitting diodes 11 mounted on the conductor wire 13 with a translucent sealing member 15. Silicone resin, epoxy resin, glass, and the like can be used as the translucent sealing member 15. The term "translucent" means that 50% or more of incident light is transmitted. The sealing member 15 may contain a phosphor which performs wavelength conversion of light from the light-emitting diodes 11 to light with a different wavelength. Accordingly, since various colors and emission spectra including white and warm white color can be provided, the needs of a wide range of markets can be addressed.

Specifically, when the light-emitting diodes 11 emit blue light, examples of the phosphor include a YAG-based phosphor that emits yellow light, an LAG phosphor or a SiAlON phosphor which emits green light, and a CASN phosphor or a SCASN phosphor which emits red light. By having the sealing member 15 contain these phosphors, a SiAlON phosphor that emits green light and a CASN phosphor that emits red light can be combined with the light-emitting diodes 11 that emit blue light. As a result, a light-emitting device which has high color reproducibility and which is suitable as a light source for backlighting of a television or the like can be realized. In addition, by having the sealing member 15 contain a combination of an LAG phosphor or a YAG phosphor that emits green to yellow light and a red light-emitting phosphor, a light-emitting device which has a higher color rendering property (Ra) than when using one phosphor and which is capable of emitting white light and light bulb color light suitable as a light source for illumination can be realized.

Furthermore, the sealing member 15 may also contain a light-diffusing member that scatters light. Accordingly, a desired light distribution can be obtained or color unevenness can be prevented. Examples of a material of the light-diffusing member include $TiO_2$, $SiO_2$, $Al_2O_3$, MgO, $MgCO_3$, $CaCO_3$, $Mg(OH)_2$, and $Ca(OH)_2$.

Favorably, the sealing member 15 seals the mounting portions and the conductor wire 13 around the mounting portions in addition to the light-emitting diodes 11. Accordingly, since strength of the light-emitting device can be increased and yield can be improved, the light-emitting device can be inexpensively formed.

Sealing by the sealing member 15 can be performed by various methods including molding using a casting case, potting on the light-emitting diodes 11, printing, transfer molding, compression molding, and injection molding. In addition, sealing by the sealing member 15 can be performed individually on each light-emitting diodes 11 (the first sealing method example described later) or the plurality of light-emitting diodes 11 can be collectively sealed (the second sealing method example described later).

As long as the present step is performed after the second step, the present step may be performed before or after the third step. In other words, as long as the light-emitting diodes 11 have already been mounted to the mounting portions, sealing may be performed in a state where the distance between mounting portions is set to L2 or in a state where the distance between mounting portions is set to L3. By performing the present step before the third step, tact can be increased due to a similar reason to the mounting of the light-emitting devices 11 and an inexpensive light-emitting device can be realized.

FIG. 3 is a diagram illustrating a first sealing method example, in which FIG. 3A is a top view, FIG. 3B is a side view, and FIG. 3C is a front view.

As shown in FIG. 3, in this embodiment, after the plurality of light-emitting diodes 11 are individually sealed by a phosphor-containing dome-shaped first sealing member 15a, the first sealing member 15a may be further individually sealed by a dome-shaped second sealing member 15b. Accordingly, the mounting portions and the conductor wire 13 around the mounting portions can be sealed in addition to the light-emitting diodes 11. In addition, since the sealing member 15 is formed in a plurality of layers, protection of the light-emitting diodes 11 and mechanical strength of the light-emitting device can be achieved.

FIG. 4 is a diagram illustrating a second sealing method example, in which FIG. 4A is a top view. FIG. 4B is a side view, and FIG. 4C is a front view.

As shown in FIG. 4, in this embodiment, after the plurality of light-emitting diodes 11 are individually sealed by a phosphor-containing first sealing member 15a, a plurality of first sealing members 15a may be collectively sealed by a second sealing member 15b. Accordingly, the mounting portions and the conductor wire 13 around the mounting portions can be sealed in addition to the light-emitting diodes 11. In addition, since the sealing member 15 is formed in a plurality of layers, protection of the light-emitting diodes 11 and mechanical strength of the light-emitting device can be achieved.

In the first and second sealing method examples described above, favorably, LED chips are used as the light-emitting diodes 11 and the LED chips are directly covered by the first sealing member 15a. Accordingly, cost reduction due to a reduced number of components and a reduction in steps can be achieved.

In addition, favorably, a material that is softer than that of the second sealing member 15b is used for the first sealing member 15a. In other words, favorably, a material that is harder than that of the first sealing member 15a is used for the second sealing member 15b. Accordingly, electrical connection failure such as disconnection of a wire due to stress created by a difference in thermal expansion between materials can be prevented. In this case, a "soft material" refers to a material with a low glass-transition point such as silicone resin, and a "hard material" refers to a material with a high glass-transition point such as epoxy resin.

With the light-emitting device manufacturing method according to the embodiments described above, when manufacturing a light-emitting device having the plurality of light-emitting diodes 11 mounted to mounting portions on the conductor wire 13, the straight-line distance L2 between adjacent mounting portions on the conductor wire 13 becomes shorter than the distance L1 along the conductor wire 13 between the mounting portions. Therefore, a takt time of a mounting device that is used to mount the light-emitting diodes 11 on the conductor wire 13 can be reduced and the number of light-emitting diodes 11 that can be mounted per unit time can be increased.

Therefore, with the light-emitting device manufacturing method according to embodiments of the present invention, work efficiency can be improved and a light-emitting device using the light-emitting diodes 11 can be manufactured more inexpensively than in the past.

Next, examples will be described.

FIRST EXAMPLE

As a first example, a light-emitting device manufacturing method using a fabric-style bending method will be described. A light-emitting device manufacturing method using a fabric-style bending method is a method of setting a straight-line distance between the adjacent mounting portions to L2 by intersecting the conductor wire 13 with a plurality of rod members. According to this method, by increasing a mounting density of the light-emitting diodes 11, a takt time of the mounting device can be reduced and mass production and cost reduction can be promoted. In addition, since this method enables the mounting portions on the conductor wire 13 to be arranged two-dimensionally (in a direction in which the conductor wire 13 is extended and a direction perpendicular thereto), the method is suitable for forming a planar light-emitting device.

[Example (Example 1) of a Light-emitting Device Manufacturing Method Using a Fabric-Style Bending Method]

Figure 5A:
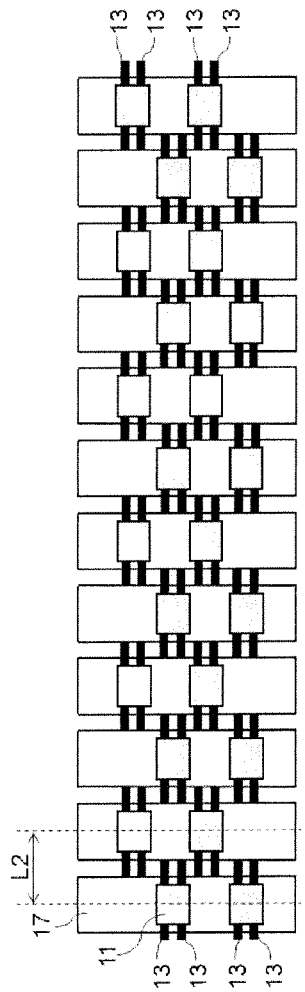
FIG. 5A is an upper view of a plurality of rod members and the conductor wire intersecting with the rod members.
Figure 5B:
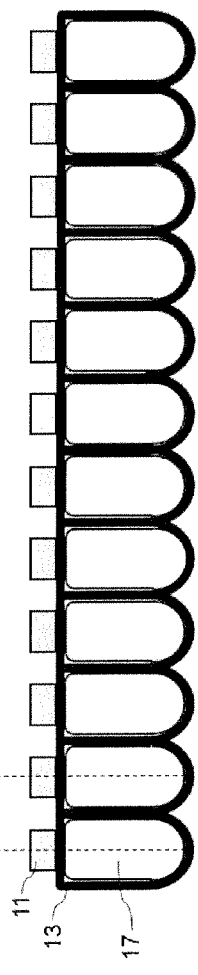
FIG. 5B is a side view of the plurality of rod members and the conductor wire intersecting with the rod members.
Figure 5C:
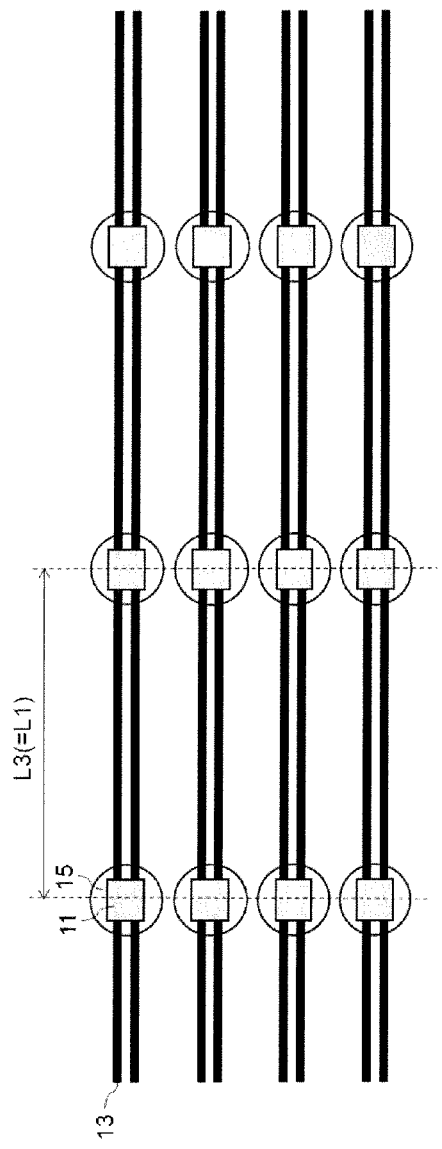
FIG. 5C is an upper view of the conductor wire that has been extended.

FIG. 5 is a diagram showing an example (Example 1) of a light-emitting device manufacturing method using a fabric-style bending method, in which FIG. 5A is an upper view of a plurality of rod members 17 and the conductor wire 13 intersecting with the rod members 17, FIG. 5B is a side view of the plurality of rod members 17 and the conductor wire 13 intersecting with the rod members 17, and FIG. 5C is an upper view of the conductor wire 13 that has been extended.

As shown in FIG. 5, with the example (Example 1) of a light-emitting device manufacturing method using a fabric-style bending method, eight conductor wires 13 are aligned approximately parallel to each other and intersected with the plurality of rod members 17. Accordingly, the straight-line distances between the adjacent mounting portions on the eight conductor wires 13 can be simultaneously set to L2.

The eight conductor wires 13 are used so that every two conductor wires form a pair, and the plurality of light-emitting diodes 11 is mounted so as to straddle one of the conductor wires 13 (an anode) and the other conductor wire 13 (a cathode) among a pair of conductor wires 13.

The eight conductor wires 13 are intersected so that two adjacent pairs of conductor wires 13 appear on upper surfaces of different rod members 17 when upper surfaces of the plurality of rod members 17 are viewed. Accordingly, since the mounting portions on two adjacent pairs of conductor wires 13 become closer to each other compared to a case where the two adjacent pairs of conductor wires 13 are intersected so as to appear on an upper surface of a same rod member 17, the mounting density of the light-emitting diodes 11 is increased. As a result, a takt time of the mounting device can be reduced and mass production and cost reduction can be promoted.

The conductor wire 13 on which the plurality of light-emitting diodes 11 have been mounted was extended so that the straight-line distances between the adjacent mounting portions were set to L3 (L3=L1), and the plurality of light-emitting diodes 11 were respectively scaled by the sealing member 15. In the light-emitting device manufactured in this manner, the plurality of light-emitting diodes 11 are connected in parallel as shown in FIG. 5C. A mode in which the conductor wire 13 is "extended" is an example of a mode where retention of the conductor wire 13 is released. With a light-emitting device such as that according to the present embodiment, L2+size of light-emitting diode≤L3 is true.

[Example (Example 2) of a Light-emitting Device Manufacturing Method Using a Fabric-Style Bending Method]

Figures 6A, 6B, 6C:
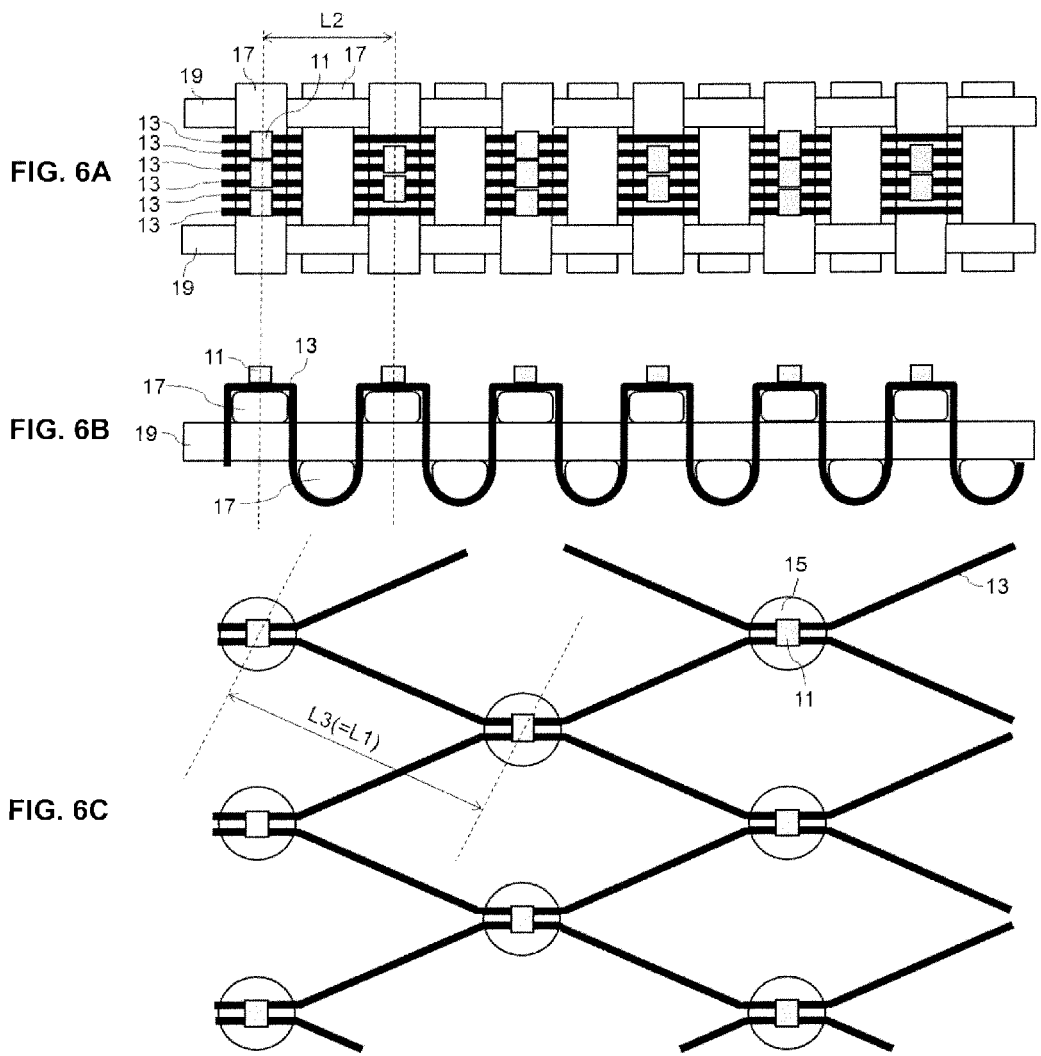
FIG. 6A is an upper view of a plurality of rod members and the conductor wire intersecting with the rod members.
FIG. 6B is a side view of the plurality of rod members and the conductor wire intersecting with the rod members.
FIG. 6C is an upper view of the conductor wire that has been extended.

FIG. 6 is a diagram showing an example (Example 2) of a light-emitting device manufacturing method using a fabric-style bending method, in which FIG. 6A is an upper view of a plurality of rod members 17 and the conductor wire 13 intersecting with the rod members 17, FIG. 6B is a side view of the plurality of rod members 17 and the conductor wire 13 intersecting with the rod members 17, and FIG. 6C is an upper view of the conductor wire 13 that has been extended.

As shown in FIG. 6, with the example (Example 2) of a light-emitting device manufacturing method using a fabric-style bending method, six conductor wires 13 are intersected with a plurality of aligned rod members 17.

The six conductor wires 13 are intersected so that adjacent conductor wires 13 appear on upper surfaces of odd-numbered rod members 17 when upper surfaces of the plurality of rod members 17 are viewed.

The six conductor wires 13 are used so that every two conductor wires form a pair, and the plurality of light-emitting diodes 11 are flip-chip mounted so as to straddle one conductor wire 13 (an anode) and the other conductor wire 13 (a cathode) among adjacent conductor wires 13. However, the plurality of light-emitting diodes 11 straddle different conductor wires 13 at a (1+n×4)-th rod member 17 and a (3+n× 4)-th rod member 17 (where n is an integer equal to or greater than 0). In other words, the conductor wire 13 that is used as an anode on an upper surface of the (1+n×4)-th rod member 17 is used as a cathode on an upper surface of the (3+n×4)-th rod member 17, and the conductor wire 13 that is used as a cathode on an upper surface of the (1+n×4)-th rod member 17 is used as an anode on an upper surface of the (3+n×4)-th rod member 17.

With the example (Example 2) of a light-emitting device manufacturing method using a fabric-style bending method, a plurality of rod members 17 are aligned in an upper tier and a lower tier, and a spacing-maintaining member 19 is provided between a plurality of rod members 17 aligned in the upper tier and a plurality of rod members 17 aligned in the lower tier. Accordingly, compared to a case where the plurality of rod members 17 are aligned in one tier, the respective mounting portions of the conductor wire 13 can be brought even closer to each other and a takt time can be further reduced.

Observing the upper surface after extending the six conductor wires 13 on which the plurality of light-emitting diodes 11 have been mounted so that the straight-line distances between the adjacent mounting portions are set to L3 (L3=L1) and sealing the plurality of light-emitting diodes 11 by the sealing member 15 reveals that the plurality of light-emitting diodes 11 are connected in parallel-series as shown in FIG. 6C. As described earlier, a mode in which the conductor wire 13 is "extended" is an example of a mode where retention of the conductor wire 13 is released.

[Example (Example 3) of a Light-emitting Device Manufacturing Method Using a Fabric-Style Bending Method]

Figure 7A:
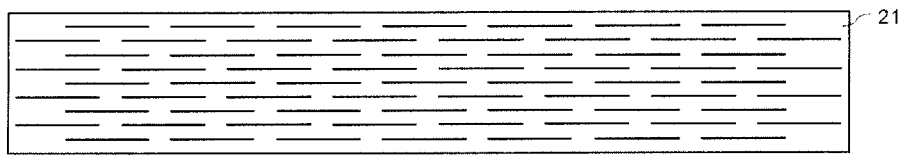
FIG. 7A is an upper view of an insulative and flexible film with a slit (an example of an insulative and flexible member to which a conductor wire can be attached)
Figure 7B:
FIG. 7B is an upper view of the conductor wire attached to the film with a slit.
Figure 7C:
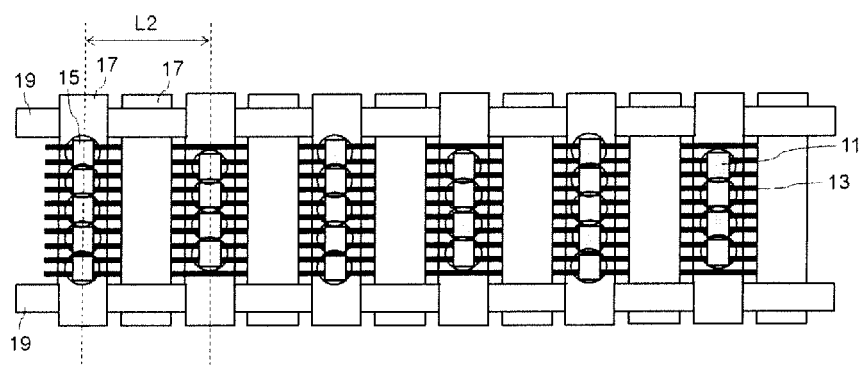
FIG. 7C is an upper view of the conductor wire attached to the film with a slit and a plurality of rod members.

FIG. 7 is a diagram showing an example (Example 3) of a light-emitting device manufacturing method using a fabric-style bending method, in which FIG. 7A is an upper view of an insulative and flexible film 21 with a slit (an example of an insulative and flexible member to which a conductor wire can be attached), FIG. 7B is an upper view of the conductor wire 13 attached to the film 21 with a slit, and FIG. 7C is an upper view of the conductor wire 13 attached to the film 21 with a slit and a plurality of rod members 17.

As shown in FIG. 7, the example (Example 3) of a light-emitting device manufacturing method using a fabric-style bending method differs from the example (Example 2) of a manufacturing method described above which does not use the film 21 in that the conductor wire 13 is attached to the film 21 with a slit and a plurality of light-emitting diodes 11 are mounted to the conductor wire 13.

With the example (Example 3) of a light-emitting device manufacturing method using a fabric-style bending method, since the conductor wire 13 is attached to the flexible film 21, tension that acts on the light-emitting device during manufacturing and during use is absorbed by a deflection of the film 21 and mechanical stress that acts on an electric joint portion (in other words, the mounting portions) can be reduced. As a result, a light-emitting device that has a large number of disconnections can be consecutively and inexpensively mass-produced.

SECOND EXAMPLE

Next, as a second example, a light-emitting device manufacturing method using a rod-and-protrusion bending method will be described. A light-emitting device manufacturing method using a rod-and-protrusion bending method is a method of setting a straight-line distance between the adjacent mounting portions to L2 by intersecting the conductor wire 13 with a plurality of rod members and a plurality of protrusions which are alternately arranged.

According to this method, since positional adjustments of a spacing-maintaining member need not be performed even when the number of conductor wires 13 is increased and a direction in which rod members are detached can be limited to one upward direction, reel-to-reel processing can be performed more readily. As a result, since an area of a light-emitting device can be readily increased and a method of manufacturing can be readily automated, cost reduction can be achieved. In addition, with this method, since mounting portions on the conductor wire 13 can be arranged two-dimensionally, the method is suitable for realizing a planar light-emitting device that can be combined with a diffusor plate or the like to be used in a display or the like. Protrusions 23 described later are examples of a protrusion.

[Example (Example 1) of a Light-emitting Device Manufacturing Method Using a Rod-and-Protrusion Bending Method]

Figure 8A:
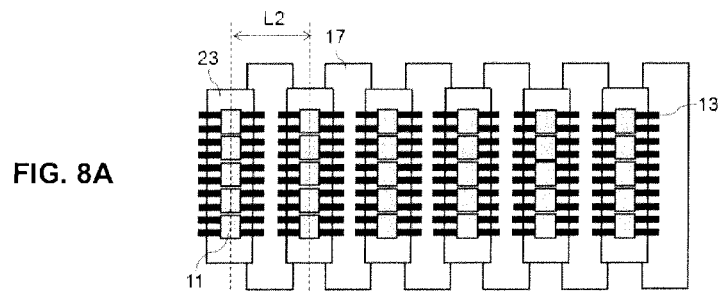
FIG. 8A is an upper view of a plurality of rod members and a plurality of protrusions and a conductor wire intersecting with the rod members and the protrusions.
Figure 8B:
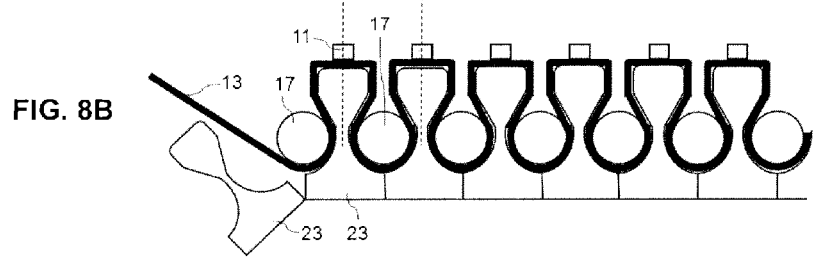
FIG. 8B is a side view of the plurality of rod members and a plurality of protrusions and a conductor wire intersecting with the rod members and the protrusions.
Figure 8C:
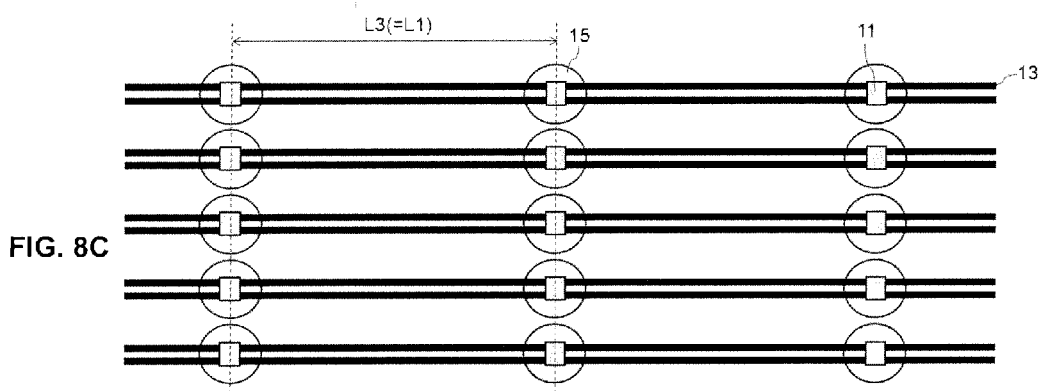
FIG. 8C is an upper view of the conductor wire that has been extended.

FIG. 8 is a diagram showing an example (Example 1) of a light-emitting device manufacturing method using a rod-and-protrusion bending method, in which FIG. 8A is an upper view of a plurality of rod members 17 and a plurality of protrusions 23 and a conductor wire 13 intersecting with the rod members 17 and the protrusions 23, FIG. 8B is a side view of the plurality of rod members 17 and a plurality of protrusions 23 and a conductor wire 13 intersecting with the rod members 17 and the protrusions 23, and FIG. 8C is an upper view of the conductor wire 13 that has been extended.

As shown in FIG. 8, with the example (Example 1) of a light-emitting device manufacturing method using a rod-and-protrusion bending method, by intersecting ten conductor wires 13 with a plurality of rod members 17 and a plurality of protrusions 23 which are alternately arranged, straight-line distances between the adjacent mounting portions on the conductor wires 13 are simultaneously set to L2.

The ten conductor wires 13 are intersected so that adjacent conductor wires 13 appear on upper surfaces of the respective protrusions 23 when upper surfaces of the plurality of rod members 17 are viewed.

The ten conductor wires 13 are used so that every two conductor wires form a pair, and the plurality of light-emitting diodes 11 are mounted so as to straddle one of the conductor wires 13 (an anode) and the other conductor wire 13 (a cathode) among adjacent conductor wires 13.

Observing the upper surface after detaching the conductor wires 13 from the rods, extending the ten conductor wires 13 on which the plurality of light-emitting diodes 11 have been mounted so that the straight-line distances between the adjacent mounting portions are set to L3 (L3=L1), and sealing the plurality of light-emitting diodes 11 by the sealing member 15 reveals that the plurality of light-emitting diodes 11 is connected in parallel as shown in FIG. 8C. As described earlier, a mode in which the conductor wire 13 is "extended" is an example of a mode where retention of the conductor wire 13 is released.

[Example (Example 2) of a Light-emitting Device Manufacturing Method Using a Rod-and-Protrusion Bending Method]

Figure 9A:
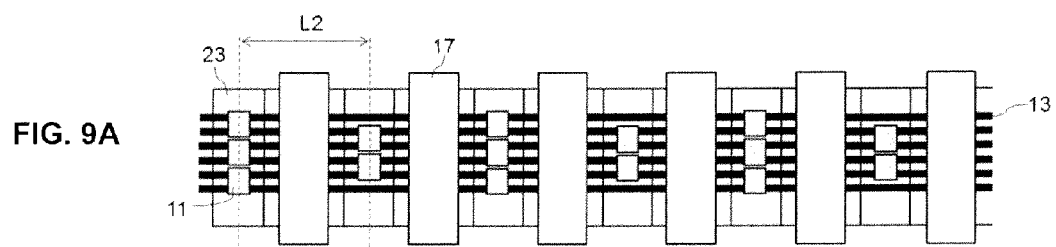
FIG. 9A is an upper view of a plurality of rod members and a plurality of protrusions and a conductor wire intersecting with the rod members and the protrusions.
Figure 9B:
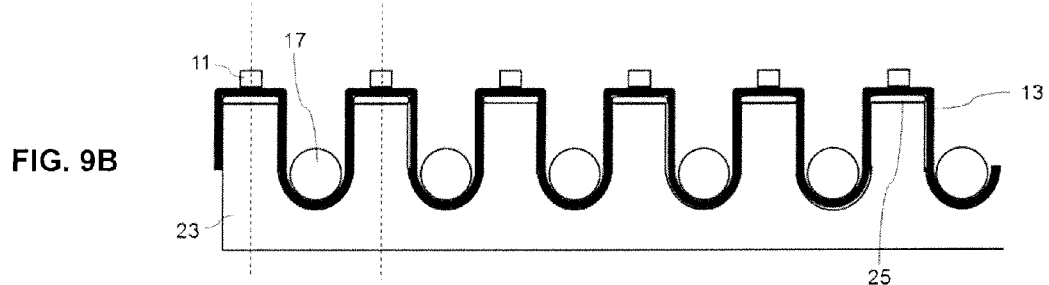
FIG. 9B is a side view of the plurality of rod members and a plurality of protrusions and a conductor wire intersecting with the rod members and the protrusions.
Figure 9C:
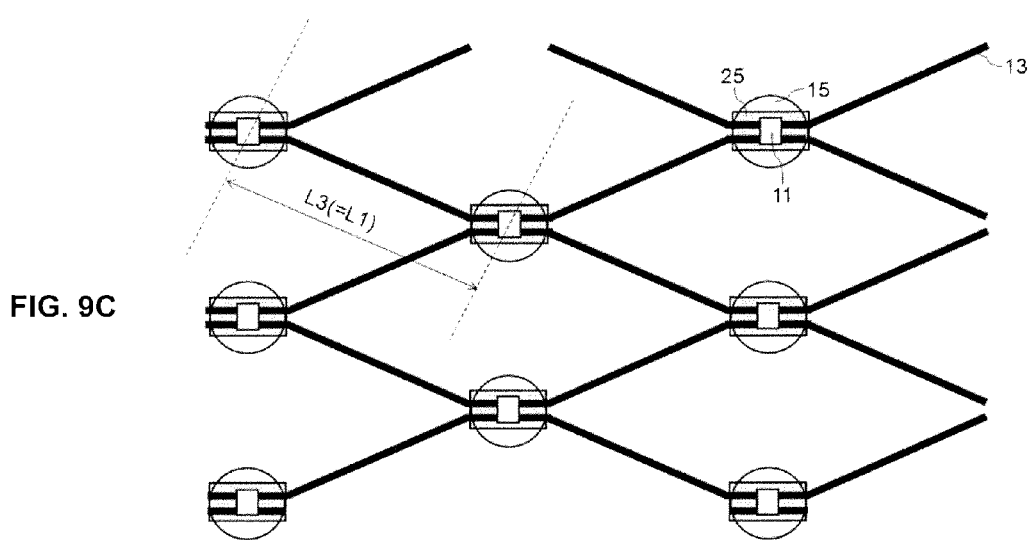
FIG. 9C is an upper view of the conductor wire that has been extended.

FIG. 9 is a diagram showing an example (Example 2) of a light-emitting device manufacturing method using a rod-and-protrusion bending method, in which FIG. 9A is an upper view of a plurality of rod members 17 and a plurality of protrusions 23 and a conductor wire 13 intersecting with the rod members 17 and the protrusions 23, FIG. 9B is a side view of the plurality of rod members 17 and a plurality of protrusions 23 and a conductor wire 13 intersecting with the rod members 17 and the protrusions 23, and FIG. 9C is an upper view of the conductor wire 13 that has been extended.

As shown in FIG. 9, with the example (Example 2) of a light-emitting device manufacturing method using a rod-and-protrusion bending method, by intersecting six conductor wires 13 with a plurality of rod members 17 and a plurality of protrusions 23 which are alternately arranged, straight-line distances between the adjacent mounting portions on the conductor wires 13 are simultaneously set to L2.

The six conductor wires 13 are intersected so that adjacent conductor wires 13 appear on upper surfaces of the respective protrusions 23 when upper surfaces of the plurality of rod members 17 are viewed.

The six conductor wires 13 are used so that every two conductor wires form a pair, and the plurality of light-emitting diodes 11 is mounted so as to straddle one conductor wire 13 (an anode) and the other conductor wire 13 (a cathode) among adjacent conductor wires 13. The plurality of light-emitting diodes 11 straddle different conductor wires 13 at odd-number rod members 17 and even-number rod members 17. In this manner, the example (Example 2) of a light-emitting device manufacturing method using a rod-and-protrusion bending method provides a net-like light-emitting device in which the plurality of light-emitting diodes 11 are mounted at sections where the conductor wires intersect with each other.

Observing the upper surface after extending the six conductor wires 13 on which the plurality of light-emitting diodes 11 have been mounted so that the straight-line distances between the adjacent mounting portions are set to L3 (L3=L1) and sealing the plurality of light-emitting diodes 11 by the sealing member 15 reveals that the plurality of light-emitting diodes 11 are connected in parallel-series as shown in FIG. 9C. As described earlier, a mode in which the conductor wire 13 is "extended" is an example of a mode where retention of the conductor wire 13 is released.

With the example (Example 2) of a light-emitting device manufacturing method using a rod-and-protrusion bending method, a plurality of protrusions 23 are integrally formed.

In addition, with the example (Example 2) of a light-emitting device manufacturing method using a rod-and-protrusion bending method, a film piece 25 (an example of a member to which the conductor wire can be attached) is provided on an upper surface of the plurality of protrusions 23 to adhere adjacent conductor wires 13.

[Example (Example 3) of a Light-emitting Device Manufacturing Method Using a Rod-and-Protrusion Bending Method]

FIG. 10 is a diagram showing an example (Example 3) of a light-emitting device manufacturing method using a rod-and-protrusion bending method, in which FIGS. 10A to 10C, 10E, and 10F are upper views. In addition, FIG. 10D shows an upper view and a side view.

Figure 10D:
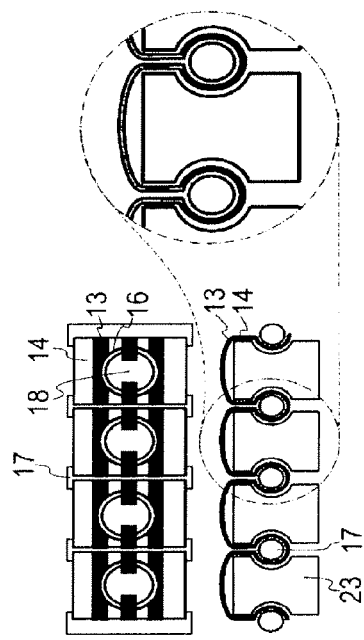
FIG. 10D shows an upper view and a side view.
Figure 10E:
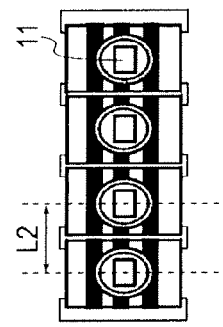
FIGS. 10A to 10C, 10E, and 10F are upper views.
Figure 10F:
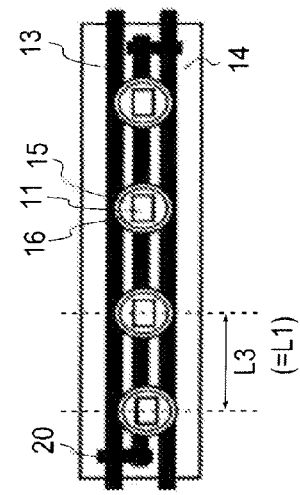
Figure 10A:
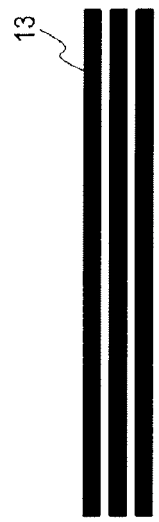
Figure 10B:
Figure 10C:
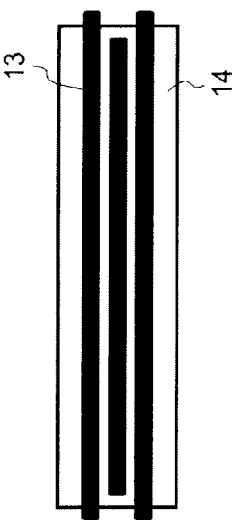

With the example (Example 3) of a light-emitting device manufacturing method using a rod-and-protrusion bending method, three conductor wires 13 are arranged substantially parallel to each other (refer to FIG. 10A), and the three conductor wires 13 are cut to a predetermined length by a press or the like (refer to FIG. 10B).

Next, the three cut conductor wires 13 are attached to and integrated with a single insulative and flexible substrate 14 (an example of an insulative and flexible member to which the conductor wires 13 can be attached) (refer to FIG. 10C), and intersected with the plurality of rod members 17 and the plurality of protrusions 23 (refer to FIG. 10D. As shown in a partial enlarged view in FIG. 10D, since the substrate 14 is flexible, a part of the substrate 14 is deflected together with the conductor wires 13). Accordingly, the straight-line distance between the adjacent mounting portions on the conductor wires 13 are set to L2. A reflective material 18 and an embankment portion 16 are provided on and around the mounting portions of the three conductor wires 13 (refer to FIG. 10D).

Next, the light-emitting diodes 11 are mounted to the respective mounting portions of the three conductor wires 13 and the light-emitting diodes 11 are sealed by the sealing member 15 (refer to FIG. 10E).

Subsequently, the conductor wires 13 on which the plurality of light-emitting diodes 11 are mounted is extended so that the straight-line distances between the adjacent mounting portions are set to L3 (L3=L1) (refer to FIG. 10F). As described earlier, a mode in which the conductor wire 13 is "extended" is an example of a mode where retention of the conductor wire 13 is released.

As shown in FIG. 10F, by providing a short-circuit conducting wire 20 on the conductor wires 13 using a method such as fusing, the plurality of light-emitting diodes 11 can be connected in series.

[Example (Example 4) of a Light-emitting Device Manufacturing Method Using a Rod-and-Protrusion Bending Method]

Figure 11A:
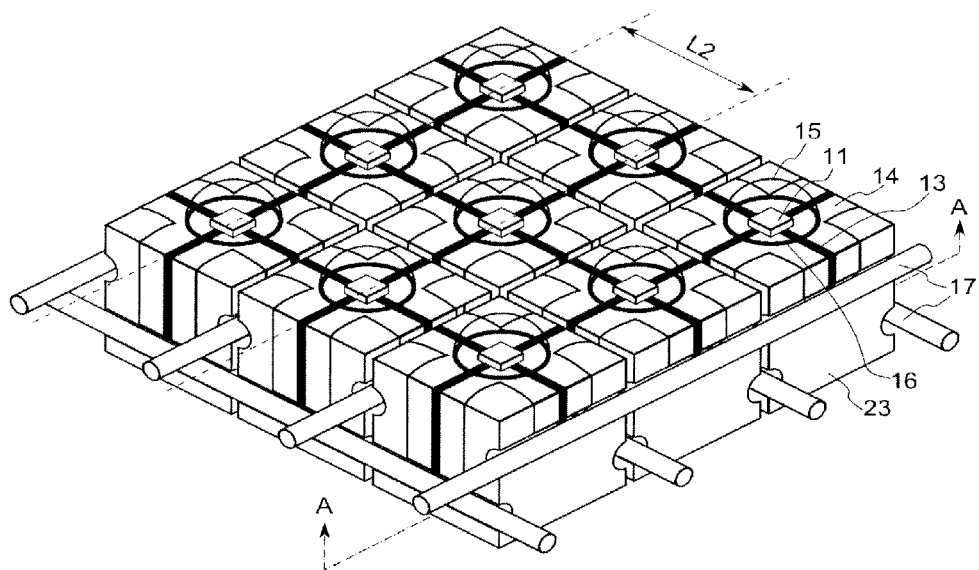
FIG. 11A is a diagram showing conductor wires and a substrate intersecting with a plurality of rod members and a plurality of protrusions.
Figure 11B:
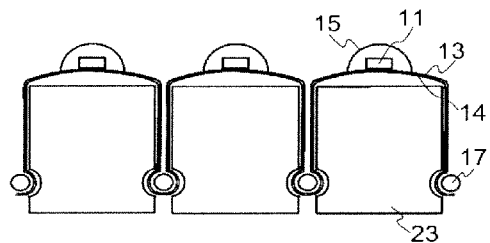
FIG. 11B is a diagram showing a cross section taken along A-A in FIG. 11A.
Figure 11C:
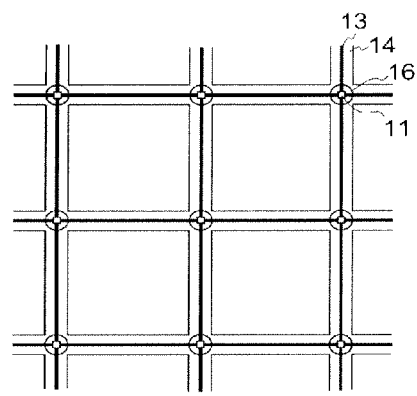
FIG. 11C is a diagram showing the conductor wires and the substrate having been extended.

FIG. 11 is a diagram showing an example (Example 4) of a light-emitting device manufacturing method using a rod-and-protrusion bending method, in which FIG. 11A is a diagram showing conductor wires 13 and a substrate 14 intersecting with a plurality of rod members 17 and a plurality of protrusions 23, FIG. 11B is a diagram showing a cross section taken along A-A in FIG. 11A, and FIG. 11C is a diagram showing the conductor wires 13 and the substrate 14 having been extended.

In the example shown in FIG. 11, the conductor wires 13 were cut by a press or the like to a predetermined length, and the plurality of cut conductor wires 13 were attached to and integrated with a net-like substrate 14 and vertically and horizontally intersected with the plurality of rod members 17 and the plurality of protrusions 23.

Light-emitting diodes 11 are mounted to the mounting portions of the plurality of conductor wires 13, and the light-emitting diodes 11 are sealed by the sealing member 15. An embankment portion 16 is provided around the mounting portions in order to prevent the sealing member 15 from spreading unnecessarily.

While examples of a light-emitting device manufacturing method using a rod-and-protrusion bending method have been described above, sealing of the plurality of light-emitting diodes 11 may be performed after releasing the retention of the conductor wire 13 as shown in (Example 1) to (Example 3) or before releasing the retention as shown in (Example 4).

THIRD EXAMPLE

Next, as a third example, a light-emitting device manufacturing method using a rod-winding bending method will be described. A light-emitting device manufacturing method using a rod-winding bending method is a method of setting a straight-line distance to L2 by winding the conductor wire 13 around a rod member. According to this method, since a light-emitting device can now be manufactured with an inexpensive manufacturing device with a simple construction, a light-emitting device can be manufactured inexpensively (in addition, an installation area of the device can be reduced).

[Example (Example 1) of a Light-emitting Device Manufacturing Method Using a Rod-Winding Bending Method]

Figure 12A:
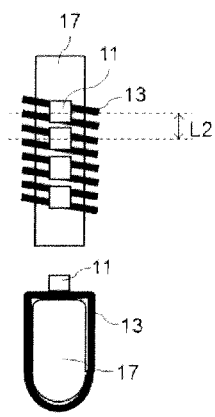
FIG. 12A is an upper view and a front view of a rod member and a conductor wire wound around the rod member.
Figure 12B:
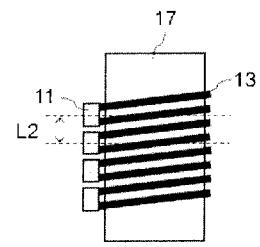
FIG. 12B is a side view of the rod member and the conductor wire wound around the rod member.
Figure 12C:
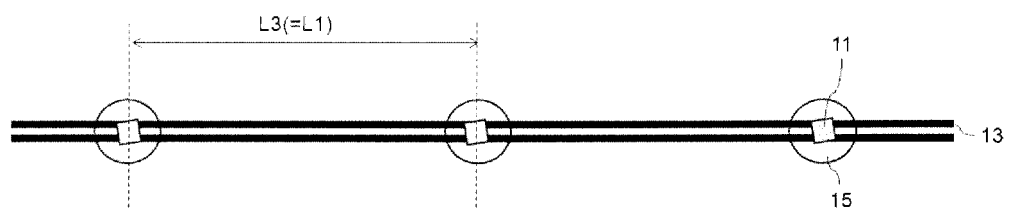
FIG. 12C is an upper view of the conductor wire that has been extended.

FIG. 12 is a diagram showing an example (Example 1) of a light-emitting device manufacturing method using a rod-winding bending method, in which FIG. 12A is an upper view and a front view of a rod member 17 and a conductor wire 13 wound around the rod member 17, FIG. 12B is a side view of the rod member 17 and the conductor wire 13 wound around the rod member 17, and FIG. 12C is an upper view of the conductor wire 13 that has been extended. The rod-winding bending method is capable of realizing a simpler structure than the fabric-style bending method and the rod-and-protrusion bending method and is suitable for manufacturing a linear light-emitting device such as a straight-tube LED lamp.

As shown in FIG. 12, with the example (Example 1) of a light-emitting device manufacturing method using a rod-winding bending method, two conductor wires 13 are wound around the rod member 17.

The two conductor wires 13 are used as a pair, and the plurality of light-emitting diodes 11 are mounted so as to straddle one conductor wire 13 (an anode) and the other conductor wire 13 (a cathode) of the pair of conductor wires 13 in a state where a side of the rod member 17 that is wound with the conductor wire 13 is viewed.

Observing the upper surface after extending the two conductor wires 13 on which the plurality of light-emitting diodes 11 have been mounted so that the straight-line distances between the adjacent mounting portions are set to L3 (L3=L1) and sealing the plurality of light-emitting diodes 11 by the sealing member 15 reveals that the plurality of light-emitting diodes 11 are connected in parallel as shown in FIG. 12C. As described earlier, a mode in which the conductor wire 13 is "extended" is an example of a mode where retention of the conductor wire 13 is released.

[Example (Example 2) of a Light-emitting Device Manufacturing Method Using a Rod-Winding Bending Method]

Figure 13A:
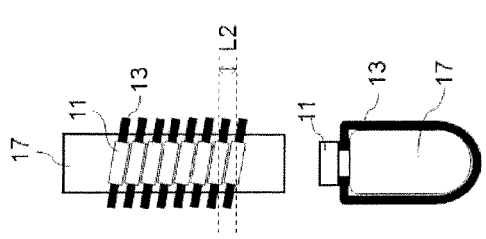
FIG. 13A is an upper view and a front view of a rod member and a conductor wire wound around the rod member (prior to cutting)
Figure 13B:
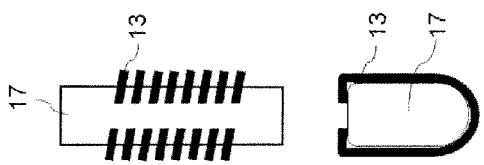
FIG. 13B is an upper view and a front view of the rod member and the conductor wire wound around the rod member (after cutting)
Figure 13C:
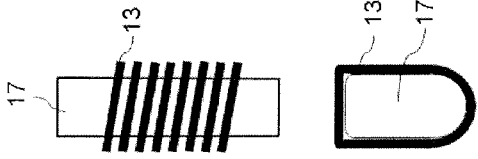
FIG. 13C is an upper view and a front view of the rod member and the conductor wire wound around the rod member (after mounting)
Figure 13D:
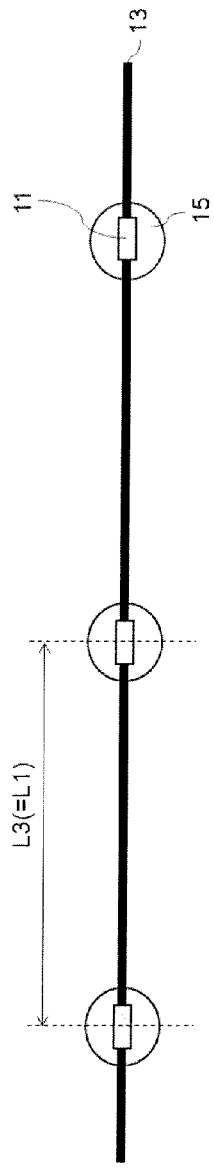
FIG. 13D is an upper view of the conductor wire that has been extended.

FIG. 13 is a diagram showing an example (Example 2) of a light-emitting device manufacturing method using a rod-winding bending method, in which FIG. 13A is an upper view and a front view of a rod member 17 and a conductor wire 13 wound around the rod member 17 (prior to cutting), FIG. 13B is an upper view and a front view of the rod member 17 and the conductor wire 13 wound around the rod member 17 (after cutting), FIG. 13C is an upper view and a front view of the rod member 17 and the conductor wire 13 wound around the rod member 17 (after mounting), and FIG. 13D is an upper view of the conductor wire 13 that has been extended.

As shown in FIG. 13, with the example (Example 2) of a light-emitting device manufacturing method using a rod-winding bending method, one conductor wire 13 is wound around the rod member 17.

The single conductor wire 13 is temporarily fixed by being wound around the rod member 17 using a film or the like and is cut along a longitudinal direction of the rod member 17. The plurality of light-emitting diodes 11 are mounted to the single conductor wire 13 with one end and the other end created by the cutting acting as an anode and a cathode.

Observing the upper surface after extending the single conductor wire 13 on which the plurality of light-emitting diodes 11 have been mounted so that the straight-line distances between the adjacent mounting portions are set to L3 (L3=L1) and sealing the plurality of light-emitting diodes 11 by the sealing member 15 reveals that the plurality of light-emitting diodes 11 are connected in series as shown in FIG. 13D. As described earlier, a mode in which the conductor wire 13 is "extended" is an example of a mode where retention of the conductor wire 13 is released.

[Example (Example 3) of a Light-emitting Device Manufacturing Method Using a Rod-Winding Bending Method]

FIG. 14 is a diagram showing an example (Example 3) of a light-emitting device manufacturing method using a rod-winding bending method, in which FIG. 14A is a diagram showing how a conductor wire 13 is attached to a substrate 14 using a roller 27, FIG. 14B is an upper view of a rod member 17 and the conductor wire 13 and the substrate 14 wound around the rod member 17 (prior to cutting), FIG. 14C is an upper view of the rod member 17 and the conductor wire 13 and the substrate 14 wound around the rod member 17 (after cutting), FIG. 14D is an upper view and a front view of the rod member 17 and the conductor wire 13 and the substrate 14 wound around the rod member 17 (after removal of coating), FIG. 14E is an upper view and a front view of the rod member 17 and the conductor wire 13 and the substrate 14 wound around the rod member 17 (after mounting), and FIG. 14F is a diagram showing an example of the extended conductor wire 13.

As shown in FIG. 14, with the example (Example 3) of a light-emitting device manufacturing method using a rod-winding bending method, one conductor wire 13 is wound around the rod member 17. An enameled wire is used as the conductor wire 13 and is wound around the rod member 17 and subsequently cut along the longitudinal direction of the rod member 17.

The plurality of light-emitting diodes 11 are mounted to the single conductor wire 13 with one end and the other end created by the cutting acting as an anode and a cathode.

Observing the upper surface after extending the single enameled wire on which the plurality of light-emitting diodes 11 have been mounted so that the straight-line distances between the adjacent mounting portions are set to L3 (L3=L1) and sealing the plurality of light-emitting diodes 11 by the sealing member 15 reveals that the plurality of light-emitting diodes 11 are connected in series as shown in FIG. 14F. As described earlier, a mode in which the conductor wire 13 is "extended" is an example of a mode where retention of the conductor wire 13 is released.

FOURTH EXAMPLE

Next, as a fourth example, a light-emitting device manufacturing method using a rod-cutting bending method will be described. A light-emitting device manufacturing method using a rod-cutting bending method is a method of setting a straight-line distance between the adjacent mounting portions to L2 by winding the conductor wire 13 around a rod member and subsequently cutting the rod member along a longitudinal direction of the rod member. According to this method, absorption of light by the conductor wire 13 is suppressed and an efficient light-emitting device can be realized. In addition, blocking of light by the conductor wire 13 is reduced and a light-emitting device with a wide light distribution angle can also be realized.

FIG. 15 is a diagram showing an example of a light-emitting device manufacturing method using a rod-cutting bending method, in which FIG. 15A is an upper view and a front view of a rod member 17 and a conductor wire 13 wound around the rod member 17 (prior to cutting), FIG. 15B is an upper view and a front view of the rod member 17 and the conductor wire 13 wound around the rod member 17 (after cutting), FIG. 15C is an upper view and a front view of the conductor wire 13 to which the plurality of light-emitting diodes 11 are mounted, and FIG. 15D is an upper view and a side view of the conductor wire 13 that has been extended.

As shown in FIG. 15, with the example of a light-emitting device manufacturing method using a rod-cutting bending method, after the conductor wire 13 is wound around the rod member 17, the rod member 17 is cut along a longitudinal direction thereof (therefore, the conductor wire 13 wound around the rod member 17 is also cut).

The plurality of light-emitting diodes 11 are mounted to the conductor wire 13 with two adjacent ends along the rod member 17 acting as an anode and a cathode.

Observing the upper surface after extending the conductor wire 13 on which the plurality of light-emitting diodes 11 have been mounted so that the straight-line distances between the adjacent mounting portions are set to L3 (L3=L1) and sealing the plurality of light-emitting diodes 11 by the sealing member 15 reveals that the plurality of light-emitting diodes 11 are connected in series as shown in FIG. 15D. As described earlier, a mode in which the conductor wire 13 is "extended" is an example of a mode where retention of the conductor wire 13 is released.

While the conductor wires 13 are attached to the substrate 14 and the light-emitting diodes 11 are mounted while retaining the conductor wires 13 attached to the substrate 14 in the examples shown in FIGS. 10, 11, and 14, the conductor wires 13 can also be attached to the substrate 14 in the examples shown in the other diagrams.

While embodiments and examples have been described above, it is to be understood that the descriptions merely present examples of the embodiments and are not to be construed as limiting the claims in any way.

What is claimed is:

1. A method for manufacturing a light-emitting device, the method comprising:
   retaining a conductor wire so that a straight-line distance between adjacent mounting portions while the conductor is retained is less than a distance along the conductor wire between the adjacent mounting portions;
   mounting a plurality of light emitting diodes to respective ones of the mounting portions on the retained conductor wire; and
   releasing the retention of the conductor wire on which the plurality of light-emitting diodes are mounted,
   wherein a straight-line distance between the adjacent mounting portions after the retention is released is less than or equal to the distance along the conductor wire between the adjacent mounting portions and greater than the straight-line distance between adjacent mounting portions while the conductor is retained.

2. The method according to claim 1, wherein the conductor wire is intersected with a plurality of rod members to set the straight-line distance between the adjacent mounting portions.

3. The light-emitting device manufacturing method according to claim 1, wherein the conductor wire is intersected with a plurality of rod members and a plurality of protrusions which are alternately arranged to set the straight-line distance between the adjacent mounting portions.

4. The light-emitting device manufacturing method according to claim 1, wherein the conductor wire is wound around a rod member to set the straight-line distance between the adjacent mounting portions.

5. The light-emitting device manufacturing method according to claim 1, wherein the conductor wire is wound around a rod member and the rod member is subsequently cut along a longitudinal direction to set the straight-line distance between the adjacent mounting portions.

6. The light-emitting device manufacturing method according to claim 1, further comprising, after the mounting step, sealing the plurality of light-emitting diodes mounted on the conductor wire.

7. The light-emitting device manufacturing method according to claim 6, wherein the plurality of light-emitting diodes mounted on the conductor wire are sealed by a translucent sealing member.

8. The light-emitting device manufacturing method according to claim 6, wherein the plurality of light-emitting diodes are individually sealed by a phosphor-containing first sealing member, and the first sealing member is subsequently sealed by a second sealing member.

9. The light-emitting device manufacturing method according to claim 6, wherein the plurality of light-emitting diodes are individually sealed by a phosphor-containing first sealing member, and a plurality of first sealing members are subsequently collectively sealed by a second sealing member.

10. The light-emitting device manufacturing method according to claim 6, wherein the sealing step is performed before the releasing step.

11. The light-emitting device manufacturing method according to claim 6, wherein the plurality of light-emitting diodes are individually sealed by a sealing member.

12. The light-emitting device manufacturing method according to claim 1, wherein the conductor wire is attached to a substrate, and the retention is performed while the conductor wire is attached to the substrate.

13. The light-emitting device manufacturing method according to claim 6, wherein the sealing step is performed after the releasing step.

14. The light-emitting device manufacturing method according to claim 1, wherein the light emitting diodes are LED chips.

15. The light-emitting device manufacturing method according to claim 1, wherein the conductor wire is a metal wire coated by an insulating member.

16. The light-emitting device manufacturing method according to claim 15, wherein, before the mounting step, the coating of the conductor wire is removed to expose a core.

* * * * *